United States Patent [19]

Noguchi et al.

[11] Patent Number: 5,742,052
[45] Date of Patent: Apr. 21, 1998

[54] THERMAL INFRARED DETECTOR

[75] Inventors: Toshihiro Noguchi; Nobuo Kobayashi; Yukitoshi Tamura; Toshiei Matsuzaki, all of Ichikawa, Japan

[73] Assignee: Sumitomo Metal Mining Co., Ltd., Tokyo, Japan

[21] Appl. No.: 676,295

[22] PCT Filed: Nov. 20, 1995

[86] PCT No.: PCT/JP95/02367

§ 371 Date: Jul. 18, 1996

§ 102(e) Date: Jul. 18, 1996

[87] PCT Pub. No.: WO96/16441

PCT Pub. Date: May 30, 1996

[30] Foreign Application Priority Data

Nov. 18, 1994 [JP] Japan ................................. 6-309741

[51] Int. Cl.⁶ .............................. G01J 5/02; H01L 23/14
[52] U.S. Cl. ................................. 250/338.1; 250/338.3
[58] Field of Search ........................... 250/338.1, 338.2, 250/338.3, 338.4, 332

[56] References Cited

U.S. PATENT DOCUMENTS

| | | | |
|---|---|---|---|
| 4,009,516 | 3/1977 | Chiang et al. | 250/338.3 X |
| 4,250,075 | 2/1981 | Monroe et al. | 260/33.6 |
| 4,354,109 | 10/1982 | Gelpey et al. | 250/338.3 X |
| 4,740,700 | 4/1988 | Shaham et al. | 250/332 |
| 4,815,199 | 3/1989 | Jenner et al. | 250/338.3 X |

FOREIGN PATENT DOCUMENTS

| | | |
|---|---|---|
| 0184747 | 6/1986 | European Pat. Off. . |
| 0502190 | 9/1992 | European Pat. Off. . |
| 0503063 | 9/1992 | European Pat. Off. . |
| 56-77730 | 6/1981 | Japan ................ 250/338.3 |
| 4211933 | 1/1991 | Japan . |
| 3231157 | 10/1991 | Japan . |
| 6147979 | 5/1994 | Japan . |

*Primary Examiner*—Edward J. Glick
*Attorney, Agent, or Firm*—Wigman, Cohen, Leitner & Myers

[57] ABSTRACT

An infrared detector comprising an infrared detector element for generating an electrical signal, a support for the infrared detector element, and a circuit board for receiving the electrical signal from the infrared detector element. The support is formed integrally with the circuit board. The support comprises a matrix of composite material essentially consisting of one of thermosetting resins and thermoplastic resins having a thermal deformation temperature of at least 100° C. and a tensile elastic modulus of at least 100 kgf/mm², and of carbon fibers contained in the range of 10 to 40% by weight and dispersed in the matrix. The circuit board is formed with a through-hole having an inner surface processed so as to be electrically conductive.

4 Claims, 6 Drawing Sheets

DRAWINGS

THERMAL INFRARED DETECTOR

FIELD OF THE INVENTION

This invention relates to a thermal infrared detector that is used in devices such as a radiation thermometer which measures temperature without contact, or in trespass alarms that use infrared rays radiated from a human body to warn of human presence.

DESCRIPTION OF THE PRIOR ART

Generally, infrared detectors are classified into two types, quantum and thermal. Quantum infrared detectors use the fact that a electric charge is generated directly by infrared irradiation due to the photo-electromotive effect and photo-conductive effect of the infrared detection element, and thermal infrared detectors use the change in polarization (pyroelectric-type detector), the change in resistance (bolometer) or generation of electromotive force (thermopile) that is caused by the change in temperature of the infrared detection element that rises as infrared rays are absorbed. Moreover, thermal infrared detectors must effectively convert incident infrared rays into heat, and a large temperature change of the element is necessary.

FIG. 8 shows the change of heat that is brought about by the infrared rays that are incident on the infrared detection element comprising an infrared detector element 1, a circuit board 4 and a support 20 between the infrared detector element 1 and the circuit board 4.

A part of the infrared rays that are incident on the infrared detector element 1 are reflected by the surface. The remaining part is either absorbed by the element 1 or passes through the element and exits to the outside. Of these infrared rays, those that can be effectively converted to heat and that contribute to the large change of temperature of the element 1 are the infrared rays that are absorbed by the element 1.

Moreover, the thermal energy of the infrared rays that are absorbed by the aforementioned infrared detector element 1 not only cause the temperature of the element 1 to rise, but are also radiated from the surface of the element 1 and are consumed by convection or by being transferred to the support 20 that holds the element 1.

Therefore, in order to obtain a high-precision thermal type infrared detector, it is necessary to increase the absorption efficiency of infrared rays, and it is necessary to reduce the heat that is lost from the infrared detector due to radiation, convection or heat transfer to the element support. Normally the largest of these three kinds of heat loss is the heat that is lost due to heat transfer to the support of the infrared detector element. In the prior art, there have been four systems known for preventing the heat lost due to this kind of heat transfer.

(1) FIG. 9 shows the first system. Here, metal wires, which are also used as the lead wires for fetching the generated electric signal, are used as the support 21 for the infrared detector element 1. In this method, the amount of heat lost due to the aforementioned heat transfer is the smallest, however it is very weak under impact and it is difficult to produce.

(2) FIG. 10 shows a second system. Here, in place of the metal wires used in the first method, metal pins are used as the support 22 for the infrared detector element 1. In this method, inner pins (0.5 mm dia.) of a detector package such as the TO-5 are commonly used metal pins; however, the heat capacity of this pins is large so the heat loss becomes large, and the reduction in sensitivity of the detector cannot be ignored. Therefore, when this method is actually used it is necessary to use an infrared detector element whose surface area is larger than that of the photo-receptor electrode, and the portion of the photo-receptor electrode whose temperature rises due to the infrared rays must be kept separated from the metal pins which fetch the electric signal. Therefore, the material cost of the infrared detector element 1 is very high, and there is a high possibility of the element 1 being damaged.

(3) FIG. 11 shows a third system. Here, an insulating material such as ceramic, glass or resin that is formed in a rectangular block shape is used as the support 23 for the infrared detector element 1. In this case, the signal from the infrared detector 1 is fetched by a thin, gold wire 3 that connects the element 1 to the circuit board 4, or by applying a conductive adhesive to the circuit conductor on the circuit board 4. This method is the most widely used because it makes a very durable infrared detector and is very good for mass production. However, in the method of using a thin, gold wire 3, it is very difficult to automate the connection process and there is a reduction in sensitivity of the detector due to the heat lost from the connection area. Moreover, in the method of applying a conductive adhesive, the heat capacity of the conduction adhesive used in the infrared detector element is large, and so sensitivity of the detector drops. By using a rectangular block shaped metal material as the support 23 for the infrared detector element 1, the problem of connecting the infrared detector element 1 with the circuit on the circuit board 4 no longer exists; however, the problem of preventing heat loss in the infrared detector element 1 becomes more difficult.

(4) FIG. 12 shows a fourth system. Here, there is no support for the infrared detector element 1. The element 1 is placed on the top surface of the circuit board 4 in which an adiabatic space has been formed by forming a through hole or depression in it, and the element 1 is connected directly to the circuit board 4. In this case as well, the signal from the infrared detector element 1 is fetched in the same way as described in (3) above. Also it is possible to print the conductor as a thick film on the circuit board 4 that comes in contact with the element 1 and use it directly as the leads. This method, the same as method (3) above, makes a very durable infrared detector and is very good for mass production and is very commonly used. However, a circuit for processing the signal is arranged on the surface of the circuit board 4, so that often it is not possible to use a large area for the opening of the adiabatic space resulting in that the adiabatic effect is not sufficient.

SUMMARY OF THE INVENTION

An objective of this invention is to provide an infrared detector that is durable and which is suitable for mass production as in method (3) above.

Another objective of this invention is to provide an infrared detector where it is not necessary to connect the infrared detector element with the circuit board and it is possible to reduce as much as possible the heat lost to the support of the infrared detector element, thus being able to do away with the problem of connecting the infrared detector element with the circuit board, and with the problem of heat loss in the infrared detector.

Another objective of the present invention is to provide an infrared detector that is advantageous over an infrared detector that comprises an infrared detector element, a support for the infrared detector element, and a circuit board for receiving the electrical signal generated by the infrared detector element (called the prior infrared detector below), in that the support is made of a composite material that uses a thermosetting resin or thermoplastic resin as the matrix dispersed with carbon fibers at 10 to 40% by weight and whose thermal deformation temperature is 100° C. or greater and whose tensile elastic modulus is 100 kgf/mm² or greater.

Another objective of the present invention is to provide an infrared detector that is advantageous over the prior infrared detector in that the support is made of a composite material that uses a thermosetting resin or thermoplastic resin as the matrix dispersed with carbon fibers at 10 to 40% of weight and whose thermal deformation temperature is 100° C. or greater and whose tensile elastic modulus is 100 kgf/mm² or greater, and where the inner surface of the through hole in the circuit board is processed so that it is electrically conductive, and where the support and the circuit board are integrally formed.

Moreover, another objective of the present invention is to provide an infrared detector that is advantageous over the prior infrared detector in that the support is made of a composite material that uses a thermosetting resin or thermoplastic resin as the matrix dispersed with metallic fibers at 5 to 20% by weight and whose thermal deformation temperature is 100° C. or greater and whose tensile elastic modulus is 100 kgf/mm² or greater.

Furthermore, another objective of the present invention is to provide an infrared detector that is advantageous over the prior infrared detector in that the support and the circuit board are connected with conductive adhesive, and where the support is made of a ceramic, thermosetting resin or thermoplastic resin whose (1) thermal deformation temperature is 100° C. or greater, (2) tensile elastic modulus is 100 kgf/mm² or greater and (3) thermal conductivity is $2 \ W \cdot m^{-1} \cdot K^{-1}$ or less, and whose surface is coated with a metallic film that is 0.1 to 1 μm thick.

Still, another objective of the present invention is to provide an infrared detector that is advantageous over the prior infrared detector in that the support is made of a ceramic, thermosetting resin or thermoplastic resin whose (1) thermal deformation temperature is 100° C. or greater, (2) tensile elastic modulus is 100 kgf/mm² or greater and (3) thermal conductivity is $2 \ W \cdot m^{-1} \cdot K$ or less, and whose surface is coated with a metallic film that is 1 to 10 μm thick.

The objectives, features and advantages of the present invention will become obvious from the following detailed description of the present invention taken in part, with the drawings forming an integral part thereof.

DETAILED DESCRIPTION OF THE PREFERRED EMBODIMENT

Figure 1:
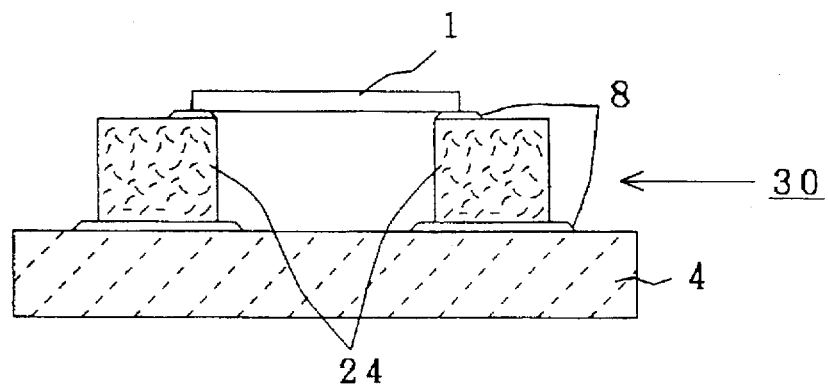
FIG. 1 is a partly cross sectional, front elevational view of the infrared detector of a first embodiment of the first and third invention.

In accordance with a first feature of the present invention, there is provided an infrared detector where the support is made of a composite material whose matrix is a thermosetting resin or thermoplastic resin that has a thermal deformation temperature of 100° C. or greater and a tensile elastic modulus of 100 kgf/mm² or greater. Here, the thermal deformation temperature is the temperature measured according to the JIS standards K 7206.

As the thermosetting resin, phenol resin, amino (urea) resin, melamine resin, unsaturated polyester, epoxy resin, etc., can be used, and as the thermoplastic resin, polypropylene, polystyrene, polyvinylchloride, polyacetal, polyamide (nylon), polycarbonate, polyphenylene ethyl, polyethylene terephthalate, polyarylate, polybutylene terephthalate, polysulfone, polyethersulfone, polyimide, polyamidimide, polyphenylene sulfide, polyoxybenzoyl, polyether etherketone (PEE-K), polyetherimide, liquid crystal polyester, polyphenylene oxide resin, etc. can be used.

The support made of a resin whose thermal deformation temperature is less than 100° C. will be unable to withstand the rise in temperature during the sensor assembly process for electrically connecting the infrared detector element with the support. Also, the support made of a resin whose tensile elastic modulus is less than 100 kgf/mm², will be unable to solidly support the infrared detector element, and especially if the detector receives some kind of impact, a torsion force will be applied to and could break the detector element.

In the first feature of the present invention, the support is made of a composite material whose matrix is a thermosetting resin or thermoplastic resin, and it is dispersed with carbon fibers at 10 to 40% by weight. By dispersing the matrix with carbon fibers, the specific resistance of the composite material is 1000 ohms·cm; or less which is sufficient for receiving the small signal current generated by the infrared detector element, so that there is no need for a connecting wire between the infrared detector element and the circuit board. Moreover, the thermal conductivity can be kept to $2 \ W \cdot m^{-1} \cdot K^{-1}$ or less which is sufficient for extremely reducing the heat loss due to heat transfer to the support of the infrared detector element.

In order to reduce the specific resistance of the aforementioned composite material even more, and to increase the wetting of the composite material, it is possible to coat the surface of the carbon fibers with a metal plate such as nickel.

If the carbon fibers are dispersed at less than 10% by weight, then it is easy for the specific resistance of the composite material to exceed 1000 ohms·cm; however, on the other hand, if the fibers are dispersed at more than 40% by weight, then it is easy for the thermal conductivity of the material to exceed 2 $W \cdot m^{-1} \cdot K^{-1}$ and the moldability using an industrial molding process such as injection molding, poured mold, or extrusion molding worsens. Moreover, in order to make the specific resistance of the composite material 1000 ohms-cm or less, and the thermal conductivity 2 $W \cdot m^{-1} \cdot K^{-1}$ or less, then the dispersion of the carbon fibers in the material must be 10 to 50% by weight.

Next, in a second feature of the present invention, there is provide an infrared detector where the support is made of composite material whose matrix is a thermosetting resin or thermoplastic resin that has a thermal deformation temperature of 100° C. or greater, and a tensile elastic modulus of 100 $kgf/mm^2$ or greater.

If the support is made of a resin whose thermal deformation temperature is less than 100° C., as was mentioned for the first invention above, it will not be able to withstand the rise in temperature of the sensor assembly process, and it will not be possible to manufacture the support and circuit board in an integral structure will be described below.

The carbon fibers used in the second invention and the amount that they are dispersed are substantially the same as those described for the first invention.

When a filler such as metallic fibers and metallic flakes other than the carbon fibers are dispersed in the matrix, the filler can get caught on the surface of the circuit board or get tangled in the through hole in the circuit board (1 mm dia. or less, usually about 0.5 mm) when forming the support and circuit board in one piece, making it difficult for the molding materials to smoothly flow through the through hole and fill the mold. In this regard, the carbon fibers, besides having good lubrication and elasticity, have a strength to be shorn when pressure is applied even if a pair of fibers are tangled; therefore, the molding materials can smoothly flow through the through hole and fill up the mold with no gaps.

Furthermore, in the second feature, the support for the infrared detector element and the circuit board are made in an integral structure. They are made in an integral structure by introducing the aforementioned composite materials of the support through the through hole formed in the circuit board and then allowing them to harden. Therefore, when molding them, in order to electrically connect the material of the support to the circuit board, the circuit board is formed with a through hole whose inside surface is processed with a thick conductive film or plating is used. This molding process is similar to the insert molding; however, it is different from the insert molding in that the composite materials only make up part of the entire molded part. Actually it is possible to use compression molding, transfer molding, injection molding, etc.

In order to improve the productivity of the circuit board, usually several tens of individual boards are made on a large single board and separated from each other with a V-shaped cut, and then, after the support and circuit board are formed into an integral structure as described above, the components are mounted onto the board. Then, they are divided from each other. With respect to the material for the circuit board, normally used epoxy resin with glass fibers can be used; however, when considering heat resistance, it is better if ceramic is used, and alumina is even better because of its good heat conductivity, and because it is good for the flow in molding of the composite material.

By making the support and circuit board into an integral structure, it is possible to manufacture the support and assemble it to the circuit board all in one process.

In a third feature of the present invention instead of dispersing carbon fibers at 10 to 40% by weight in the matrix, made of thermosetting resin or thermoplastic as in the first feature, metallic fibers are dispersed in the matrix at 5 to 20% by weight. The reason that the lower limit of dispersed metallic fibers is 5%, and that the upper limit is 20% is the same reason that the upper and lower limits of dispersion of carbon fibers are set in the first invention.

To prevent oxidation of the surface of the metallic fibers, and to increase the wetting of the aforementioned matrix, the surface of the metallic fibers are coated with plating such as gold, tin, solder or indium.

In a fourth feature of the present invention, there is provide an infrared detector where the support is made of ceramic, thermosetting resin or thermoplastic resin that has (1) thermal deformation temperature of 100° C. or greater, (2) tensile elastic modulus of 100 $kgf/mm^2$ or greater, and (3) thermal conductivity of 2 $W \cdot m^{-1} \cdot K^{-1}$ or less, and where a metallic coating is formed around the surface of the support.

The aforementioned characteristics, (1) and (2), are the same as those described for the first invention. Furthermore, for characteristic (3), if the thermal conductivity exceeds 2 $W \cdot m^{-1} \cdot K^{-1}$, the amount of heat loss due to heat transfer to the support of the infrared detector element increases.

If general ceramics are used for the support material, they will normally satisfy characteristics (1) and (2). However, some ceramics, for example alumina, will not satisfy characteristic (3). Glasses are also included in these ceramics.

Normally, the thermosetting resins or thermoplastic resins used for the support material will satisfy characteristic (3), and the thermosetting resins and thermoplastic resins mentioned for the first feature will satisfy characteristics (1) and (2).

The aforementioned support is made of ceramic, thermosetting resin, or thermoplastic resin that meets the above characteristics and whose surface is formed with a metallic coating. By forming the metallic coating on the surface, the circuit board does not need a wire for connecting it to the infrared detector element, and it is possible to adequately receive, through the metallic coating, the very small signal current (for example, in the case of a pyroelectric-type infrared detector element, the current is about $10^{-12}$ A or less) generated by the infrared detector element.

The metal used for this metallic coating is material that is normally used in electronic circuits such as, copper, gold, silver, tin, nickel or solder, and is not specifically dictated.

In the fourth feature, the support for the infrared detector element and the circuit board are connected by an electrically conductive adhesive, and the thickness of the aforementioned metallic coating must be 0.1 to 1 µm. If the thickness is less than 0.1 µm, it does not function well as an electrically conductive coating, and if it is more than 1 µm, the thermal conductivity of the support material increases due to the coating, and the sensitivity of the detector decreases, and its adhesion to the ceramic, thermosetting resin or thermoplastic resin underneath the coating becomes poor.

To form the aforementioned metallic coating, the underlayer of ceramic, thermosetting resin or thermoplastic resin is roughed up as necessary in order to improve the adhesion of the metallic coating, and then it should be treated with chemical plating, or electrolytic plating separately or in combination, as desired. Ceramic does not generally need roughing up, and it is good for forming the metallic coating on it. The mirror surface of plate glass also is sufficiently rough for forming the metallic coating around if the surface is ground to the proper dimensions and then cut. Also, for thermosetting resin and thermoplastic resin, it is possible to obtain the proper roughness if it is etched using a suitable chemical.

Finally, in a fifth feature of the present invention, instead of connecting the support in the fourth feature to the circuit board with electrically conductive adhesive, it is connected by solder, and instead of forming a 0.1 to 1 μm thick metallic coating as was done in the fourth invention, a thick metallic coating in the range of 1 to 10 μm is formed on the support. If this thickness is less than 1 μm, the fact that the coating is attacked by soldering cannot be ignored, and the soldering conditions become poor. If the thickness exceeds 10 μm, the thermal conductivity of the support material increases and the sensitivity of the detector decreases.

Now, embodiments 1 thru 9 and comparative examples 1 thru 5 will be given for the first invention.

EMBODIMENT 1

FIG. 1 shows the front elevational view of the assembled infrared detector 30.

First, the support 24 for the infrared detector element 1 is manufactured. In other words, the thermosetting resin, specifically phenol resin (made by Sumitomo Bakelite Co., Ltd.), is used as the matrix of the composite material, and it is combined with 200 to 400 μm long carbon fibers with an average diameter of 8 μm to make a composite material in which the carbon fibers are 30% by weight, and then the composite material is injected into a mold to form a molded piece of 1 mm (width)×2 mm (length)×0.5 mm (thickness). The average thermal conductivity of this molded piece was measured using the laser flash method and found to be 0.4 $W \cdot m^{-1} \cdot K^{-1}$.

Figure 2:
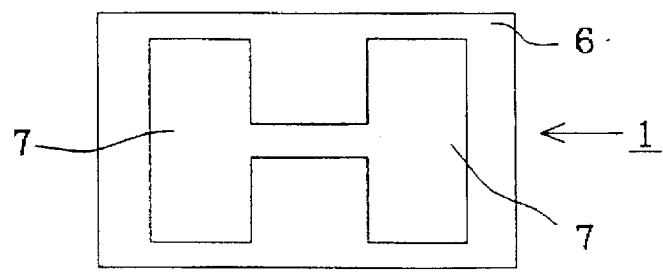
FIG. 2 is a top plan view of the infrared detector element of the infrared detector of the first embodiment of this invention.

Next, as shown in the top plan view of FIG. 2, the infrared detector element 1 is formed with a porcelain plate 6 that is made of titanate lead zirconate in the dimensions of 3.0 mm (width)×4.2 mm (length)×0.1 mm (thickness) and two electrodes 7 of 1.0 mm (width)×2.0 mm (height) are placed 1.0 mm apart in an H shape and attached using a vacuum evaporation method to the ceramic plate 6. The bottom surface of these electrodes has a little larger area than the corresponding top surface. The arrangement of these electrodes is called twin construction and their purpose is to detect human presence.

Figure 3:
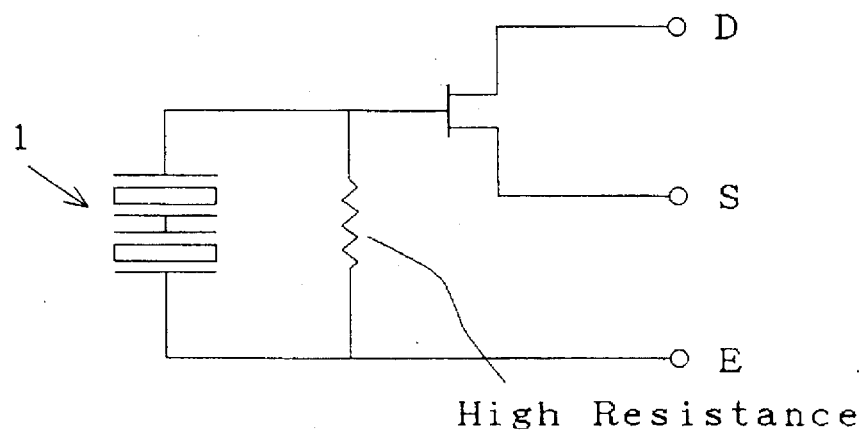
FIG. 3 is a drawing showing the equivalent circuit that is formed on the circuit board of the infrared detector of the first embodiment of this invention.

FIG. 3 shows the equivalent circuit formed by the circuit board. The equivalent circuit of the circuit board 4 is made by soldering in a high-resistance resistor ($5\times10^{11}$ ohms) and FET (2SK94), and then the circuit board 4 is soldered to a TO-5 stem.

The aforementioned support 24, element 1, and circuit board 4 were assembled as described below, and fifty infrared detectors 30 were manufactured. In other words, the support 24 and element 1 were connected electrically and fastened together, and the support 24 and circuit board 4 were connected electrically and fastened together using a small amount of silver epoxy electrically conductive adhesive 8 (type T-3030, manufactured by Sumitomo Metals and Mining Co.).

The sensitivity of the-obtained infrared detector sample 30 was measured. The sample 30 was sealed by welding a cap, with a filter that allows only 6.5 to 15 μm infrared rays to pass, to a stem in nitrogen gas. Next, the infrared rays coming from a black-body furnace set at 227° C. were passed through a chopper that was set at 1 Hz and were directed onto the sample 30. When doing this, one of the twin electrodes inside the aforementioned sample was shielded.

The incident power at the location on the sample irradiated by the infrared rays was measured using a power meter (model FTS-8110, manufactured by Ferrotex Co., Ltd.), and was found to be $2.9\times10^{-4}$ W/cm$^2$. A storage oscilloscope (model VT-5730A, manufactured by Matsushita Electronic Industries) was used to read the peak value of the response waveform of the sample output. The results showed that the average sensitivity of the aforementioned samples 30 was 134 mVp-p.

EMBODIMENTS 2 AND 3

When manufacturing the support 24 for the infrared detector element 1, liquid-crystal polyester (product name VECTRA, manufactured by. Polyplastics Co., Ltd. (embodiment 2)), which is a thermoplastic resin, and polybutylene tereophthalate (product name VALOX, manufactured by GE Plastics Co. (embodiment 3)) which is a thermoplastic resin, were used as the matrix for the composite material, and it was tested in the same manner as was done for embodiment 1.

The results of embodiments 2 and 3 were as follows: the average specific resistance was 7.5 ohms·cm and 5.8 ohms·cm respectively, the average thermal conductivity was 1.3 $W \cdot m^{-1} \cdot K^{-1}$ and 1.4 $W \cdot m^{-1} \cdot K^{-1}$ respectively, and the average sensitivity was 140 mVp-p and 135 mVp-p, respectively.

COMPARATIVE EXAMPLE 1

When manufacturing the support for the infrared detector element, the thermoplastic resin, ABS resin (manufactured by Asahi Chemical Co.), was used as the matrix for the composite material, and it was produced and tested in the same manner as was done in embodiment 1.

The results showed that the average sensitivity of 136 mVp-p was good; however, during the heat treatment, there were some detectors whose support deformed during heat treatment, and thus use of this detector is not reliable.

EMBODIMENTS 4 TO 6, COMPARATIVE EXAMPLES 2 AND 3

Carbon fibers of 200 to 400 μm length with an average diameter of 8 μm were added so that the carbon fibers were 8 to 50% by weight in the composite material, and the composite material was injected into the mold and tested in the same manner as was done in embodiment 2. In comparative example 3, it was impossible to mold the resin, so the test was canceled after molding. The obtained results are shown in Table 1.

TABLE 1

|  | Amount of carbon fibers added (% weight) | Average specific resistance (Ω cm) | Average thermal conductivity (Wm$^{-1}$ K$^{-1}$) | Average sensitivity (mV$_{p-p}$) |
| --- | --- | --- | --- | --- |
| Comparative example 2 | 8 | 3.1 × 10$^3$ | 0.9 | 86 |
| Embodiment 4 | 12 | 9.4 × 10$^2$ | 1.1 | 128 |
| Embodiment 5 | 20 | 6.2 × 10 | 1.1 | 134 |
| Embodiment 6 | 40 | 0.3 | 2.0 | 129 |
| Comparative example 3 | 50 | Molding impossible | — | — |
| Comparative example 4 | 8 | 1.0 × 10$^4$ | 0.8 | 105 |
| Embodiment 7 | 12 | 1.0 × 10$^3$ | 1.0 | 125 |
| Embodiment 8 | 20 | 4.2 × 10 | 1.3 | 130 |
| Embodiment 9 | 40 | 0.1 | 1.9 | 127 |
| Comparative example 5 | 50 | Molding impossible | — | — |

EMBODIMENTS 7 TO 9, COMPARATIVE EXAMPLES 4 AND 5

Carbon fibers of 200 to 400 μm length with an average diameter of 8 μm were added so that the carbon fibers were 8 to 50% by weight in the composite material, and the composite material was injected into the mold and tested in the same manner as was done in embodiment 3. In comparative example 5, it was impossible to mold the resin, so the test was canceled after molding. The obtained results are shown in Table 1.

The detector of embodiments 1 thru 9 had superior average sensitivity; however, the average sensitivity of the detectors of comparative examples 2 and 4 was very poor.

Next, embodiments 10 thru 15 and comparative examples 6 thru 11 will be described for the second invention.

Figure 4:
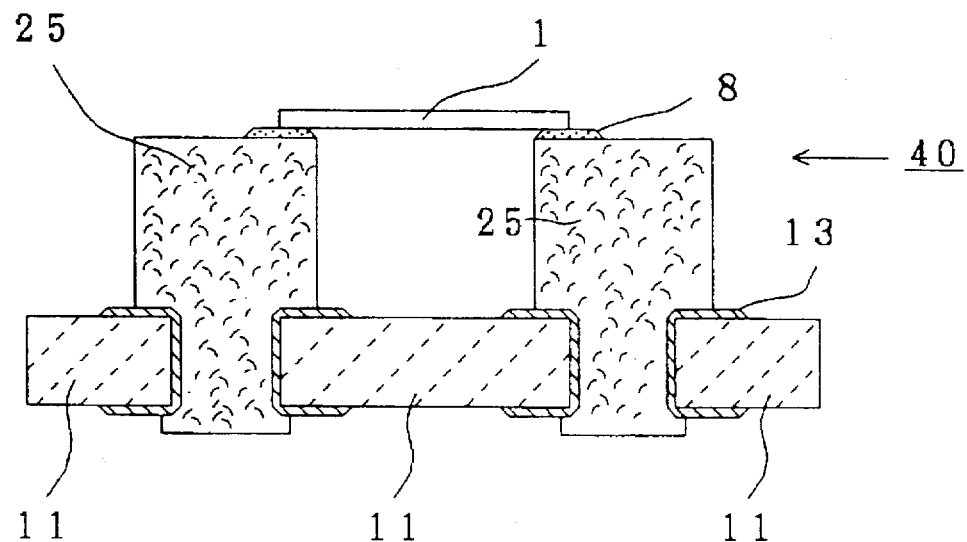
FIG. 4 is a cross-sectional view of the infrared detector of the first embodiment of the second invention.

FIG. 4 shows a cross-section of the assembled infrared detector 40.

Figure 5:
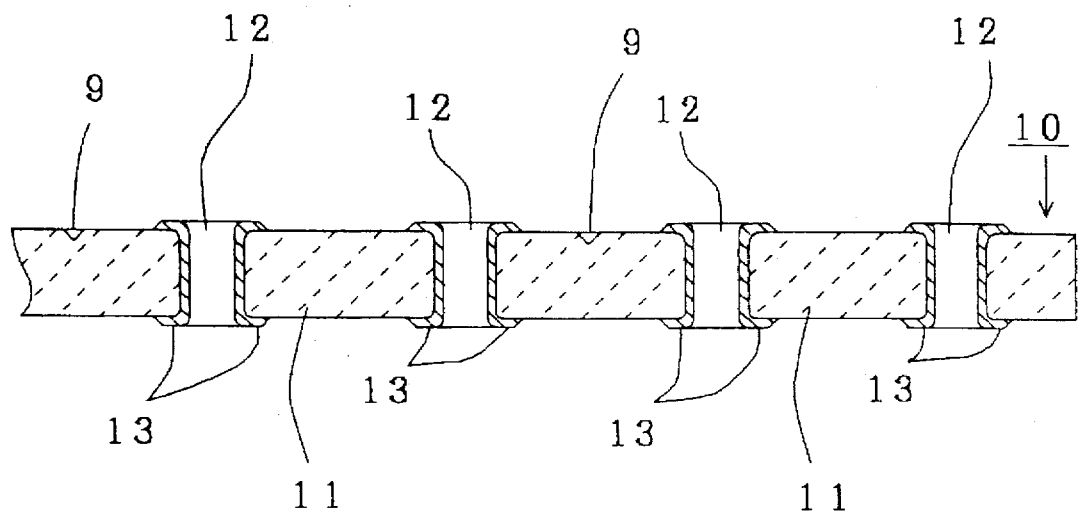
FIG. 5 is a partial cross-sectional drawing of the large circuit board of the infrared detector of the first embodiment of the second invention.

First, as shown in the cross-section drawing in FIG. 5, in order that each of the detectors can be divided up after being processed, a large board 10 (0.62 mm thick) with a V-cut 9 formed in it is used, from which seventy two circuit boards 11 (9 rows×8 columns) made of alumina can be obtained. Three holes for each of the TO-5 stem pins to pass through, and two through holes 12 (0.6 mm diameter) through which the element support material is filled for the integral molding, are formed in the circuit board 11. The inside surfaces of the through holes 12 are processed so that they are electrically conductive by firing a thick silver paste 13 on them. Moreover, the equivalent circuit shown in FIG. 3 is formed for each of the circuit boards 11.

Figure 6:
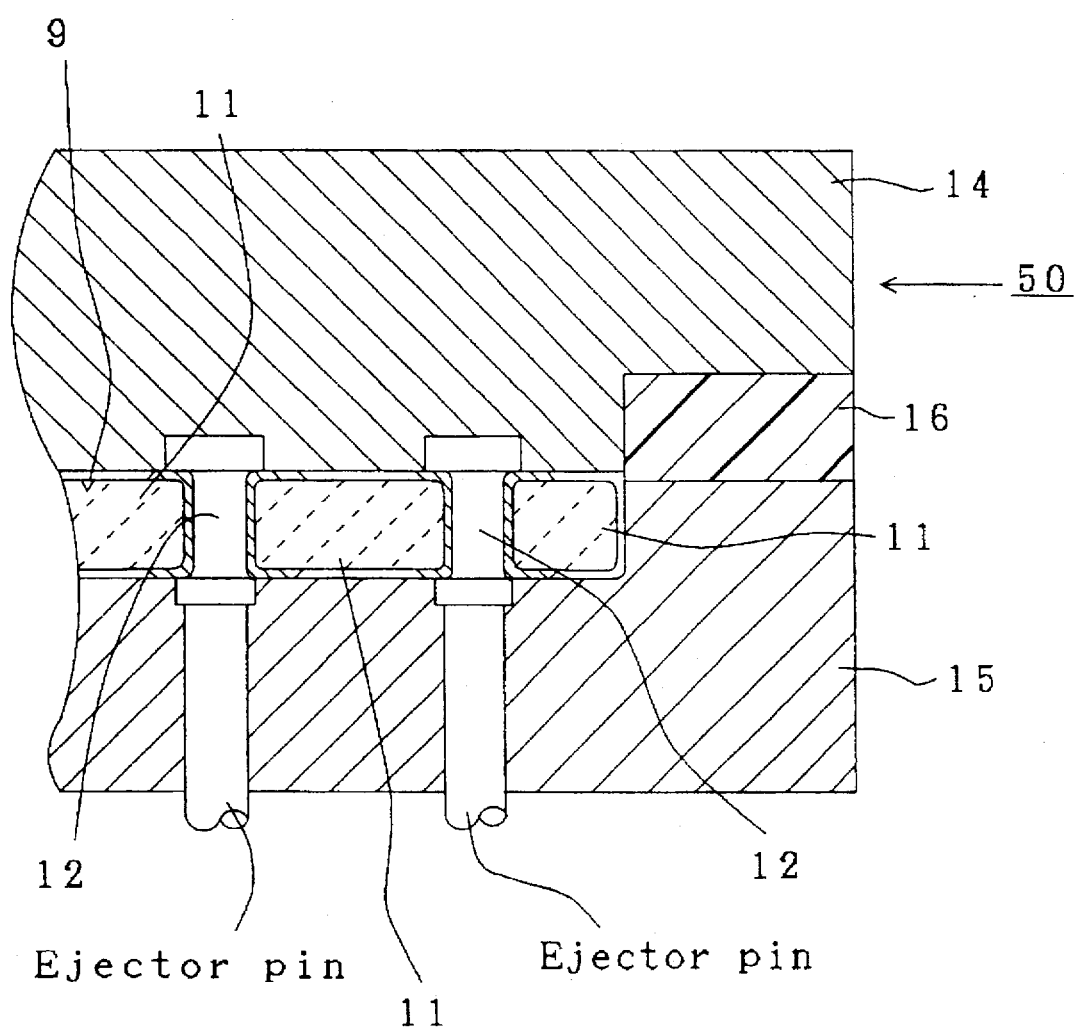
FIG. 6 is a partial cross-sectional view of the mold cavity that is used for manufacturing the integral body infrared detector of the first embodiment of the second invention.

Next, the large board 10 is set in a prescribed location inside the injection mold, and the support 25 for the infrared detector element 1 and the large board 10 are integrally formed by injection molding. FIG. 6 is a cross-sectional drawing showing the cavity of the metal mold 50. This metal mold 50 is different than a normal resin molding in that the top mold 14 and the bottom mold 15 do not come in direct contact when assembled together, but are separated by a gasket 16 made of asbestos or Teflon that acts as a buffer. If this gasket 16 is not used, because differences in thickness and warps in the circuit board 11 occur, the circuit boards 11 may break when placing the top mold 14 and bottom mold 15 of the mold 50 together. In order to be able to use this gasket 16, the top mold 14 is ground off by 1.0 mm.

The material for the support 25 that was injected into this mold 50, was a thermoplastic resin, liquid-crystal polyester (product name VECTRA, manufactured by Polyplastics Co., Ltd.), to which long carbon fibers of 200 to 400 μm with an average diameter of 8 μm were added, so that they made up 30% by weight of the mixture, and the dimensions of the support 25 were 1 mm (width)×2 mm (length)×0.5 mm (thickness). The temperature of the top mold 14 and the bottom mold 15 of the mold 50 during injection was 100° C.

The resistance between the surface of the support 25 and the circuit board 11, which were made into an integral structure, was measured using a voltmeter, and found to be 170 ohms. The molding conditions for this integrally molded structure were very good.

Furthermore, as was done in embodiment 1, fifty infrared detectors 50 were manufactured from this integrally molded structure, and the sensitivity of these detector samples 50 was measured. As a result, it was found that the average sensitivity of the samples 50 was 140 mVp-p.

EMBODIMENT 11 AND 12, COMPARATIVE EXAMPLES 6 AND 7

Resin, to which long carbon fibers of 200 to 400 μm with an average diameter of 8 μm were added in the amounts showed in table 2, was used as the material of the support that was injected into the mold, and the detector samples were tested in the same manner as was done for embodiment 10. In comparative example 7, it was impossible to integrally mold the resin, so the test was canceled after molding. The obtained results are shown in Table 2.

TABLE 2

|  | Matrix Product resin | Amount of carbon fibers added (% weight) | Average resistance (Ω) | Integral Molding Conditions | Average sensitivity (mV$_{p-p}$) |
| --- | --- | --- | --- | --- | --- |
| Comparative example 6 | Vectra | 8 | 9000 | Burrs occurred | 70 |
| Embodiment 11 | Vectra | 15 | 2100 | Good | 135 |

TABLE 2-continued

|  | Matrix Product resin | Amount of carbon fibers added (% weight) | Average resistance (Ω) | Integral Molding Conditions | Average sensitivity (mV$_{p-p}$) |
|---|---|---|---|---|---|
| Embodiment 12 | Vectra | 40 | 20 | Good | 135 |
| Comparative example 7 | Vectra | 50 | — | Molding impossible | — |
| Comparative example 8 | Valox | 8 | 21000 | Burrs occurred | 86 |
| Embodiment 13 | Valox | 14 | 2300 | Very Good | 130 |
| Embodiment 14 | Valox | 30 | 110 | Very Good | 138 |
| Embodiment 15 | Valox | 40 | 15 | Very Good | 132 |
| Comparative example 9 | Valox | 50 | — | Molding e impossible | — |

EMBODIMENTS 13 THRU 15, COMPARATIVE EXAMPLES 8 AND 9

A thermoplastic resin, polybutylene tereophthalate (product name VALOX, manufactured by GE Plastics Co. (comparative example 11)), to which carbon fibers of 200 to 400 μm length with an average diameter of 8 μm were added in amounts shown in Table 2, was used as the material for the support that was injected into the mold, and it was tested in the same manner as was done for embodiment 10. In comparative example 9, the resin could not be integrally molded, so the test was canceled after molding. The obtained results are shown in Table 2.

COMPARATIVE EXAMPLES 10 AND 11

Thermoplastic resin, liquid-crystal polyester (product name VECTRA, manufactured by Polyplastics Ltd, (comparative example 10)) and polybutylene tereophthalate (product name VALOX, manufactured by GE Plastics Co. (comparative example 11)), to which copper fibers of 0.5 mm length with a diameter of 30 μm were added so that they were 10% by weight in the composite material, was used as the composite material for the support that was injected into the mold, and it was integrally molded and tested in the same manner as was done in embodiment 10.

In all of the comparative examples, the composite material got plugged in the gates of the mold, and it was impossible to obtain a good mold; therefore, the test was canceled.

Embodiments 16 thru 24 and comparative examples 12 and 13 will be described for the third invention.

EMBODIMENT 16

Instead of carbon fibers, copper fibers of 5 to 6 mm length with an average diameter of 50 μm were added to the resin so that they were 15% by weight in the composite material, and this composite material was injected into the mold and tested in the same manner as was done in embodiment 2.

The results showed that the average specific resistance was 0.2 Ohms·cm, the average thermal conductivity was 1.3 W·m$^{-1}$·K$^{-1}$ and the average sensitivity was 140 mVp-p.

EMBODIMENTS 17 THRU 19, COMPARATIVE EXAMPLES 12 AND 13

The resin to which copper fibers of 5 to 6 mm length with an average diameter of 50 μm were added in the range of 3 to 25% by weight, and this composite material was injected into the mold and tested in the same manner as was done in embodiment 16. The obtained results are shown in Table 3.

TABLE 3

|  | Metallic fibers | | Average specific resistance (Ω cm) | Average thermal conductivity (Wm$^{-1}$ K$^{-1}$) | Average sensitivity (mV$_{p-p}$) |
|---|---|---|---|---|---|
|  | Material | Amount added (% weight) |  |  |  |
| Comparative example 12 | Copper | 3 | 200 | 0.9 | 86 |
| Embodiment 17 | Copper | 5 | 10 | 1.1 | 129 |
| Embodiment 18 | Copper | 8 | 0.7 | 1.1 | 134 |
| Embodiment 19 | Copper | 20 | 0.06 | 1.8 | 124 |
| Comparative example 13 | Copper | 25 | 0.001 | 2.1 | 119 |
| Embodiment 20 | Brass | 15 | 0.3 | 1.3 | 139 |
| Embodiment 21 | Brass | 20 | 0.08 | 1.9 | 121 |
| Embodiment 22 | Stainless Steel | 15 | 0.5 | 1.2 | 126 |
| Embodiment 23 | Stainless Steel | 20 | 0.02 | 1.8 | 123 |
| Embodiment 24 | Copper + Stainless Steel | 20 | 0.01 | 1.9 | 129 |

NOTES:
1. Brass: Contains Zinc at 40% of weight
2. Stainless steel: SUS304
3. Copper + stainless steel: Mixture ratio (by weight) 1:1

EMBODIMENTS 20 THRU 24

Brass fibers, stainless steel fibers or copper+stainless steel fibers are used instead of copper fibers as the metallic fibers that were added to the resin and injected into the mold and then tested in the same manner as was done in embodiments 16 and 19. The obtained results are shown in Table 3.

Next, embodiments 25 thru 29, and comparative examples 14 thru 18, will be described for the fourth invention.

EMBODIMENT 25

Figure 7:
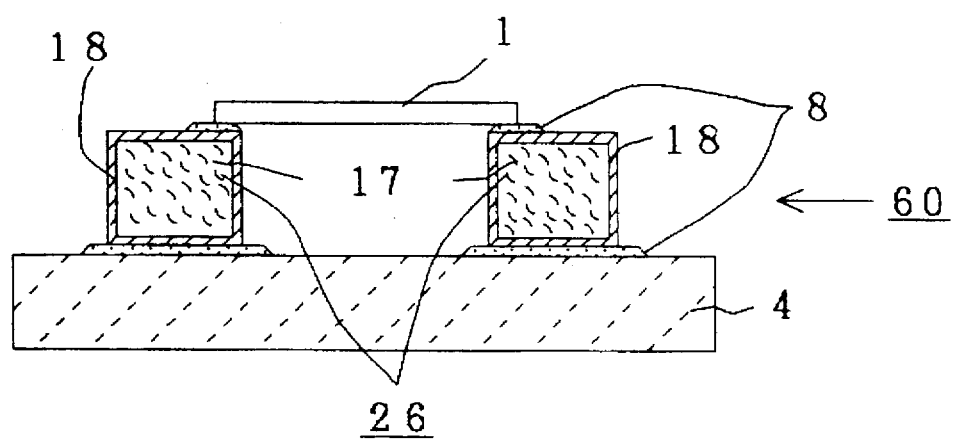
FIG. 7 is a cross-sectional view of the infrared detector of the first embodiment of the fourth invention.
Figure 8:
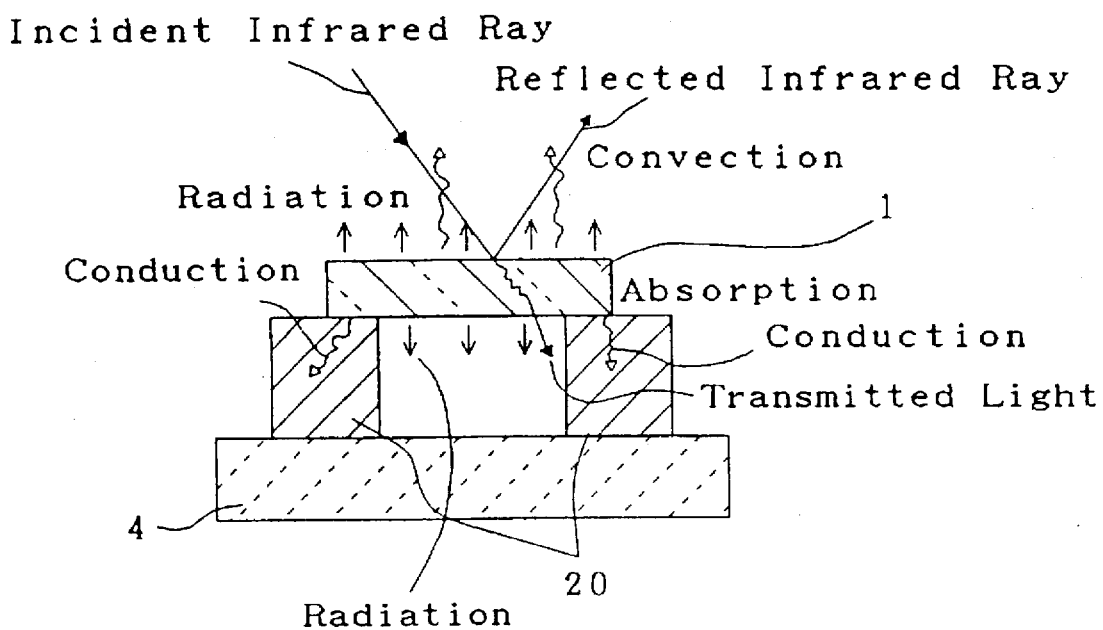
FIG. 8 is a cross-sectional view that explains the transition of heat brought by infrared rays that are incident on the infrared detector element of a prior type thermal infrared detector.
Figure 9:
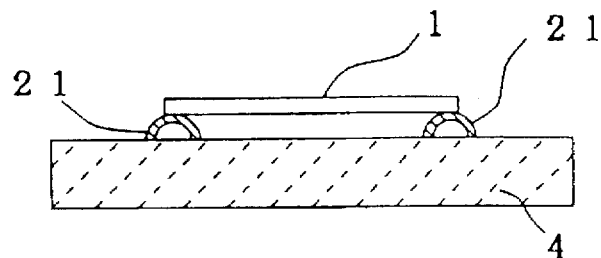
FIG. 9 is a cross-sectional view showing a first system used for a prior thermal infrared detector.
Figure 10:
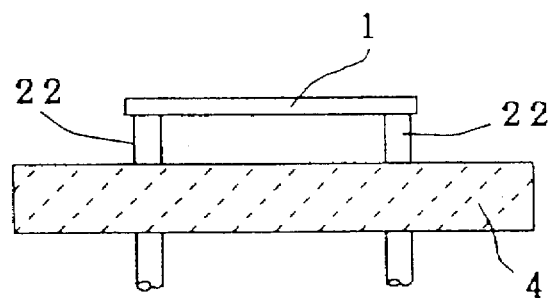
FIG. 10 is a cross-sectional view showing a second system used for a prior thermal infrared detector.

FIG. 7 shows a cross-sectional view of the assembled infrared detector 60.

First, the support 26 for the infrared detector element 1 is manufactured. A kitchen porcelain material having a thermal deformation temperature of 100° C. or greater, a tensile elastic modulus of 100 kgf/mm$^2$ or greater, and a thermal conductivity of 1.5 W·m$^{-1}$·K$^{-1}$ was used as the support material, and this kitchen porcelain material was machined so that the porcelain material 17 had a rectangular block shape with dimensions of 1 mm (width)×2 mm (length)×0.5 mm (thickness). Next, a nickel coating 18 of 1.1 μm thickness was formed around the surface of the porcelain material 17 using a chemical plating process. The chemical plating was performed as follows. The aforementioned porcelain material 17 was degreased for 30 minutes at 50° C. in a degreasing fluid comprised of boric acid soda, phosphoric acid soda and an interfacial active agent. It was then etched for 10 minutes at 65° C. in a mixture comprising of chronic acid and sulphuric acid (400 g/l each), and then rinsed. Furthermore, the porcelain material 17 was immersed in a catalyst comprising palladium chloride, stannous chloride and hydrochloric acid, after which palladium was precipitated on to the porcelain material 17 in sulphuric acid. Then it was processed for 15 minutes at 40° C. in a chemical plating solution with a ph of 8 to 9, comprising nickel sulphate, hypophosphoric acid soda and ammonium citrate (at 30, 20 and 50 g/l respectively). The thickness of the formed coating 18 was found by measuring the coating formed on a separate test sample of the porcelain material that was processed in the same way at the same time as the aforementioned porcelain material 17.

As was done in the first embodiment, fifty infrared detectors 60 were manufactured for samples, and the sensitivity and sensitivity balance were measured for these detectors 60.

The results showed that the average sensitivity of the detectors 60 was 122 mVp-p, and that the average sensitivity balance was 5%. The sensitivity balance is the variation between V1 and V2, where V1 and V2 are the sensitivity of the two electrodes, and is defined as (V1−V2)/(V1+V2)×100.

Moreover, a drop test was performed on the infrared detectors 60 whose sensitivity was measured. The infrared detectors 60 were dropped three times onto an oak board from a height of 75 cm, and then checked for abnormalities. As a result, no abnormalities were found on any of the infrared detectors 60.

EMBODIMENTS 26 THRU 29

When manufacturing the support 26 for the infrared detector element 1, soda glass (thermal deformation temperature: 100° C. or greater, tensile elastic modulus: 100 kgf/mm$^2$ or greater, thermal conductivity: 0.6 W·m$^{-1}$·K$^{-1}$ (embodiments 26 and 27)), ABS resin (with a length of 200 to 400 μm), glass fibers with an average diameter of 8 μm added by 20% by weight (thermal deformation temperature: 115° C., tensile elastic modulus: 100 kgf/mm$^2$ or greater, thermal conductivity: 0.3 W·m$^{-1}$·K$^{-1}$ (embodiment 28)), and polybutylene tereophthalate (thermal deformation temperature: 100° C. or greater, tensile elastic modulus: 100 kgf/mm$^2$ or greater, thermal conductivity: 0.2 W·m$^{-1}$·K$^{-1}$ (embodiment 29)) were used as the support material, and a nickel coating was formed around it with a thickness as shown in Table 4 using chemical plating, and thus prepared and then tested in the same manner as was done for embodiment 25 (however, in embodiments 28 and 29, the rectangular block shaped support was manufactured using injection molding). The thickness of the coating was regulated by changing the temperature and processing time of the degreasing solution, etching solution, and chemical plating solution. The obtained results are shown in Table 4.

TABLE 4

| | Support material | Coating thickness (μm) | Average sensitivity (mV$_{p-p}$) | Average sensitivity balance (%) |
|---|---|---|---|---|
| Embodiment 26 | Soda glass | 0.15 | 126 | 3 |
| Embodiment 27 | Soda glass | 0.9 | 127 | 6 |
| Embodiment 28 | ABS resin with glass fibers | 1.3 | 133 | 4 |
| Embodiment 29 | Polybutylene tereophthalate | 0.9 | 136 | 4 |
| Comparative example 14 | Alumina | 0.9 | 105 | 9 |
| Comparative example 15 | Silicon rubber | 0.8 | 130 | 7 |
| Comparative example 16 | ABS resin | — | 112 | 15 |
| Comparative example 17 | Acrylic resin | — | 129 | 19 |
| Comparative example 18 | Polybutylene tereophthalate | — | 117 | 12 |

The detectors of embodiments 26 thru 29 had very excellent average sensitivity and sensitivity balance. Also, the results of the drop test for the detectors of these embodiments were substantially the same as those for embodiment 25.

COMPARATIVE EXAMPLES 14 AND 15

When manufacturing the support for the infrared detector element 1, alumina (purity: 96% by weight, thermal deformation temperature: 100° C. or greater, tensile elastic modulus: 100 kgf/mm$^2$ or greater, thermal conductivity: 20 W·m$^{-1}$·K$^{-1}$ (comparative example 14)) and silicone rubber (thermal deformation temperature: 100° C. or greater, tensile elastic modulus: less than 100 kgf/mm$^2$, thermal conductivity: 0.1 W·m$^{-1}$·K$^{-1}$ (comparative example 15)) were used as the material for the support, and a nickel coating was formed around it at thicknesses shown in Table 4 using a chemical plating process, and thus prepared and then tested in the same manner as was done for embodiment 25. The thickness was regulated by changing the temperature and processing time of the degreasing solution, etching solution and electroless plating solution. The obtained results are shown in Table 4.

The average sensitivity balance of the detector of comparative example 14 was good; however, the average sensitivity had greatly decreased. Also, the average sensitivity and average sensitivity balance of the detector of comparative example 15 were good; however, during the chemical plating process, there were many poorly plated places where the coating had peeled or the coating was insufficient, and the damage rate during the drop test was 20%, which was very high.

COMPARATIVE EXAMPLES 16 THRU 18

Figure 11:
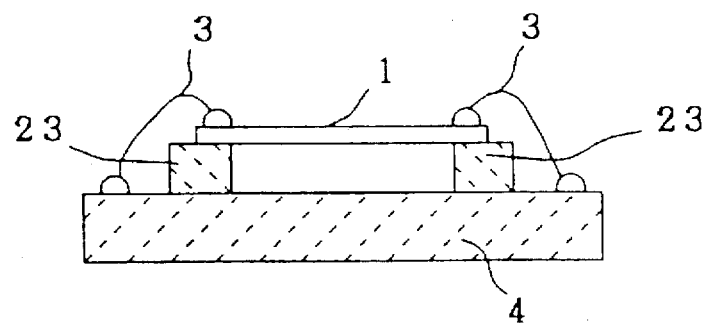
FIG. 11 is a cross-sectional view showing a third system used for a prior thermal infrared detector.
Figure 12:
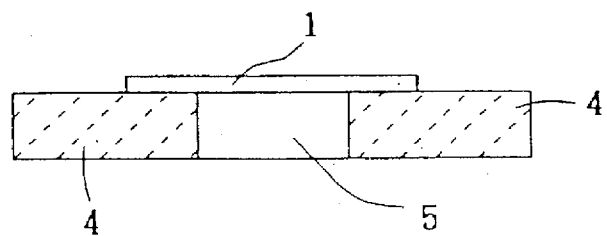
FIG. 12 is a cross-sectional view showing a fourth system used for a prior thermal infrared detector.

Fifty of the infrared detectors shown in FIG. 11 were manufactured.

When manufacturing the support 23 for the infrared detector element 1, ABS resin (thermal deformation temperature: less than 100° C., thermal conductivity: 0.3 W·m$^{-1}$ $_1 \cdot K^{-1}$ (comparative example 16)), acrylic resin (thermal deformation temperature: less than 100° C., thermal conductivity: 0.2 $W \cdot m^{-1} \cdot K^{-1}$ (comparative example 17)), and polybutylene tereophthalate (comparative example 18) were used as the support material, and no coating was formed around it using a chemical plating process. Also, when assembling the support 23 made of the aforementioned material to the detector element 1 and circuit board 4, the detector element 1 and circuit board 4 were connected using a gold wire 3 of 30 μm in diameter. This detector was then tested in the same manner as was done for embodiment 28.

The obtained results are shown in Table 4.

The average sensitivity of the detectors of comparative examples 16 thru 18 was good or a little less than good; however, the average sensitivity balance had increased, so that there were no parts that passed the examination. Also, in comparative examples 16 and 17, when the support 23 and element 1 were connected electrically and fastened together, and when the support 23 and circuit board 4 were connected electrically and fastened together, respectively, using a small amount of silver epoxy electrically conductive adhesive 8 (type T-3030, manufactured by Sumitomo Metals and Mining Co.), the detectors were deformed, resulting in assembly failures due to the lower thermal deformation temperature of the support material.

Finally, embodiments 30 thru 34, and comparative examples 19 thru 22 will be described for the fifth invention.

EMBODIMENTS 30 THRU 32, COMPARATIVE EXAMPLES 19 THRU 24

Here, the support material was covered with nickel coating with thickness as shown in Table 5, using a chemical plating process or combination of chemical and electrolytic plating processes; when assembling the support, detector element and circuit board, solder was used to electrically connect and fasten the support to the detector element, and to electrically connect and fasten the support to the circuit board. The detector was thus prepared and then tested in the same manner as was done for embodiment 26. When performing the soldering, cream solder was applied to the circuit board, and then the support was placed on top of it and passed through a reflow furnace.

The results of the obtained samples are shown in Table 5. In comparative examples 19 thru 21, the soldering conditions were poor, and therefore the tests were canceled after assembling the detector.

TABLE 5

| | Coating thickness (μm) | Soldering condition | Average sensitivity ($mV_{p-p}$) | Average sensitivity balance (%) |
|---|---|---|---|---|
| Comparative example 19 | 0.08 | Soldering impossible | — | — |
| Comparative example 20 | 0.23 | Soldering impossible | — | — |
| Comparative example 21 | 0.55 | Soldering impossible | — | — |
| Comparative example 22 | 0.80 | 30% bad | 125 | 5 |
| Embodiment 30 | 1.5 | 95% good | 129 | 6 |
| Embodiment 31 | 4.0 | 100% good | 128 | 6 |
| Embodiment 32 | 7.9 | 100% good | 128 | 3 |
| Comparative example 23 | 10.7 | 100% good | 118 | 8 |
| Comparative example 24 | 15.1 | 100% good | 113 | 5 |

As can be seen in Table 5, in embodiments 30 thru 32, the soldering condition, sensitivity and sensitivity balance were all good. In contrast to this, the soldering conditions in comparative examples 19 thru 22 were extremely poor in plating; in comparative example 23, the sensitivity and sensitivity balance had decreased; in comparative example 24, the sensitivity had decreased.

Moreover, the drop test was performed for embodiments 30 thru 32, and there were no detectors in which any abnormalities were found.

Lastly, an example of a prior detector will be described.

PRIOR EXAMPLE

Fifty infrared detectors as shown in FIG. 11 were manufactured.

When manufacturing the support 23 for the infrared detector element 1, ordinary plate glass (1 mm (width)×2 mm (length)×0.5 mm (thickness)) was used as the material. Also, when assembling the support 23, made of the aforementioned material, with the detector element 1 and circuit board 4, a wire 3 of 30 μm diameter was used to connect the detector element 1 with the circuit board 4.

After the sample detectors were assembled, they were tested in the same manner as was done for embodiment 1. The average sensitivity of the sample was found to be 112 mVp-p.

As can be plainly seen, the infrared detectors of these inventions do not require any special processes for providing electrical conduction between the infrared detector element and the circuit board, and the amount of heat that is lost due to heat transfer to the support for the infrared detector element is very small. In addition, when manufacturing the infrared detector of the second invention, the manufacture of the support and the assembly of the support with the circuit board can all be done in one process.

Furthermore, it was possible to provide an infrared detector with optimum sensitivity by greatly improving the productivity.

We claim:

1. An infrared detector comprising an infrared detector element for generating an electrical signal, a support for the infrared detector element, and a circuit board for receiving the electrical signal from the infrared detector element, wherein the support is formed with a matrix of composite material essentially consisting of one of thermosetting resins and thermoplastic resins and carbon fibers dispersed in the matrix, said one of thermosetting resins and thermoplastic resins having a thermal deformation temperature of at least 100° C. and a tensile elastic modulus of at least 100 $kgf/mm^2$, said carbon fibers constituting in the range of 10% to 40% by weight of the matrix, and wherein the circuit board is formed with a through-hole having an inner surface processed so as to be electrically conductive, and the support is formed integrally with the circuit board.

2. The infrared detector of claim 1, wherein the circuit board is made from an alumina material.

3. The infrared detector of claim 1, wherein the thermosetting resin is selected from the group consisting of phenol resin, amino (urea) resin, melamine resin, unsaturated polyester, and epoxy resin.

4. The infrared detector of claim 1, wherein the thermoplastic resin is selected from the group consisting of polypropylene, polystyrene, polyvinylchloride, polyacetal, polyamide (nylon), polycarbonate, polyphenylene ethyl, polyethylene terephthalate, polyarylate, polybutylene terephthalate, polysulfone, polyethersulfone, polyimide, polyamidimide, polyphenylene sulfide, polyoxybenzoyl, polyether etherketone (PEE-K), polyetherimide, liquid crystal polyester and polyphenylene oxide.

* * * * *